United States Patent [19]

Viehbeck et al.

[11] Patent Number: 5,242,713
[45] Date of Patent: Sep. 7, 1993

[54] METHOD FOR CONDITIONING AN ORGANIC POLYMERIC MATERIAL

[75] Inventors: Alfred Viehbeck, Stormville; Stephen L. Buchwalter, Wappingers Falls; William A. Donson, Endicott; John J. Glenning, Vestal; Martin J. Goldberg, Mahopac; Kurt R. Grebe, Beacon, all of N.Y.; Caroline A. Kovac, Ridgefield, Conn.; Linda C. Matthew, Peekskill, N.Y.; Walter P. Pawlowski, Endicott, N.Y.; Mark J. Schadt, Vestal, N.Y.; Michael R. Scheuermann, Katonah, N.Y.; Stephen L. Tisdale, Vestal, N.Y.

[73] Assignee: International Business Machines Corporation

[21] Appl. No.: 290,486

[22] Filed: Dec. 23, 1988

[51] Int. Cl.$^5$ ............................................. C23C 26/00
[52] U.S. Cl. .................................... 427/304; 427/306
[58] Field of Search ................................. 427/304, 306

[56] References Cited

U.S. PATENT DOCUMENTS

| | | | |
|---|---|---|---|
| 3,073,736 | 1/1963 | Lange | 156/307 |
| 3,156,608 | 11/1964 | Kamins et al. | 161/269 |
| 3,395,057 | 7/1968 | Fick | 156/3 |
| 3,442,737 | 5/1969 | Reed et al. | 156/158 |
| 3,567,540 | 3/1971 | Tacheci et al. | 156/157 |
| 3,681,166 | 8/1972 | Caiola et al. | 156/308 |
| 3,769,136 | 10/1973 | Ospelt | 156/308 |
| 3,791,848 | 2/1974 | DeAngelo | 117/47 |
| 3,821,054 | 6/1974 | Trostyanskaya et al. | 156/308 |
| 3,833,436 | 9/1974 | Hillis et al. | 156/13 |

(List continued on next page.)

FOREIGN PATENT DOCUMENTS

| | | | |
|---|---|---|---|
| 990593 | 6/1976 | Canada | 427/306 |
| 1521341 | 8/1973 | Fed. Rep. of Germany | 427/306 |
| 2277114 | 1/1976 | France | |
| 2518102 | 6/1983 | France | |
| 2001877 | 1/1987 | Japan | 427/306 |

OTHER PUBLICATIONS

"Electrochemical Growth of Metal Interlayers in Polyimide Film," Mazur et al., J. Phys. Chem., 1986, 90, pp. 1365–1372.
"Electrochemistry of Aromatic Polyimides," Mazur et al., Journal of Electrochemical Society, Feb. 1987, pp. 346–353.
"Electroless Metallization of Organic Polymers Using the Polymer as a Redox Reagent: Reaction of Polyimide with Zintl Anions," Haushalter et al., Thin Solid Films, 102 (1983), pp. 161–171.
"Electrically Conductive TTF Polymers," Green et al., IBM Technical Disclosure Bulletin, vol. 20, No. 7, p. 2865, Dec. 1977.
The Merck Index, 1983 Edition, p. 473.
European Search Report (partial copy) EP 89 12 1299.
Pickup et al., "Electrodeposition of Metal Particles in Films by a Reducing Redox Polymer," Journal Electrochemical Society: Electrochemical Science and Technology, vol. 130, vol. 11, pp. 2205–2216, Nov. 1980.
Bruce et al., "Synthesis and Characterization of Structured Interphases for Hydrogen Generation. Study of an N,N'-dialkyl-4,4'-bipyridinium redox polymer/Palladium Catalyst System", Journ. Physical Chemistry, 1982, vol. 86, pp. 1552–1568.

Primary Examiner—Shrive Beck
Assistant Examiner—Vi Duong Dang
Attorney, Agent, or Firm—Pollock, Vande Sande & Priddy

[57] ABSTRACT

Certain organic polymeric materials are capable of reversibly accepting or donating electrons from a reducing entity. The redox sites in the polymer accept electrons and, as a result, a change in the properties of the polymer occurs. This change is useful in modifying or etching the polymeric material. The material can be modified by incorporation of metallic seeds into the material at a controlled depth. The seeds are incorporated by interaction of cations of the metals with the redox sites in the polymer, which cause the reduction of the cations to form the neutral metallic seeds. Subsequent exposure of the polymeric material containing the seeds to an electroless bath causes further deposition of metal having the desirable characteristic of good adhesion to the polymeric material. Etching of the polymeric material can be carried out as a result of an increase in solubility of the polymer in aprotic solvents when its redox sites have accepted electrons. The increased solubility allows openings to be etched in certain areas of the polymeric material that have been reduced, leaving other areas unchanged.

35 Claims, No Drawings

U.S. PATENT DOCUMENTS

| | | | |
|---|---|---|---|
| 3,901,755 | 8/1975 | Martin et al. | 156/308 |
| 3,902,908 | 9/1975 | Rantell et al. | 106/1 |
| 3,914,150 | 10/1975 | Hill, Jr. et al. | 156/308 |
| 3,937,857 | 2/1976 | Brummett et al. | 427/98 |
| 3,954,570 | 5/1976 | Shirk et al. | 204/15 |
| 4,039,371 | 8/1977 | Brunner et al. | 156/668 |
| 4,078,096 | 3/1978 | Redmond et al. | 427/98 |
| 4,112,139 | 9/1978 | Shirk et al. | 427/54 |
| 4,113,550 | 9/1978 | Saiki et al. | 156/656 |
| 4,137,117 | 1/1979 | Jones | 156/294 |
| 4,143,186 | 3/1979 | Davis | 427/345 |
| 4,261,800 | 4/1981 | Beckenbaugh et al. | 204/15 |
| 4,279,948 | 7/1981 | Kukanskis et al. | 427/305 |
| 4,305,997 | 12/1981 | Feldstein | 428/652 |
| 4,337,110 | 6/1982 | Antonoplos et al. | 156/307.4 |
| 4,353,778 | 10/1982 | Fineman et al. | 156/644 |
| 4,369,090 | 1/1983 | Wilson et al. | 156/644 |
| 4,399,489 | 8/1983 | Ross | 361/433 |
| 4,426,253 | 1/1984 | Kreuz et al. | 156/668 |
| 4,431,478 | 2/1984 | Yamaoka et al. | 156/668 |
| 4,436,583 | 3/1984 | Saiki et al. | 156/659.1 |
| 4,486,273 | 12/1984 | Lutfy et al. | 204/15 |
| 4,508,749 | 4/1985 | Brannon et al. | 427/43.1 |
| 4,512,855 | 4/1985 | Mazur | 204/22 |
| 4,517,254 | 5/1985 | Grapentin et al. | 428/626 |
| 4,533,574 | 8/1985 | Fryd et al. | 427/385.5 |
| 4,543,295 | 9/1985 | St. Clair et al. | 428/458 |
| 4,554,182 | 11/1985 | Bupp et al. | 427/304 |
| 4,563,371 | 1/1986 | Sirinyan et al. | 427/305 |
| 4,565,606 | 1/1986 | Cassat | 204/20 |
| 4,634,619 | 1/1987 | Lindsay et al. | 427/97 |
| 4,645,734 | 2/1987 | Takada et al. | 430/315 |
| 4,657,833 | 4/1987 | Hadley, Jr. et al. | 430/52 |
| 4,668,354 | 5/1987 | Levy | 204/130 |
| 4,692,360 | 9/1987 | Manring | 427/443.1 |
| 4,701,350 | 10/1987 | Lindsay | 427/97 |
| 4,705,720 | 11/1987 | Kundinger et al. | 428/332 |
| 4,710,310 | 12/1987 | Shinozaki et al. | 252/62.2 |
| 4,710,403 | 12/1987 | Krause et al. | 427/304 |
| 4,719,145 | 1/1988 | Neely | 428/327 |
| 4,752,529 | 6/1988 | Manring | 427/443.1 |
| 4,774,157 | 9/1988 | Manring | 427/125 |
| 4,775,449 | 10/1988 | Dumas et al. | 204/30 |

METHOD FOR CONDITIONING AN ORGANIC POLYMERIC MATERIAL

TECHNICAL FIELD

The present invention is concerned with a method for conditioning certain organic polymeric materials to render them susceptible to being etched and/or capable of having a conductive metal plated thereon from an electroless plating bath. The present invention is also concerned with employing the method for conditioning the polymeric materials to bond surfaces of the polymeric material together.

In particular, the present invention is concerned with conditioning organic polymeric materials that are capable of transporting electrons and ions in a reversible manner such as polyimides and polyesters. The method of the present invention is especially advantageous for the processing of electronic devices.

BACKGROUND ART

In the manufacture of printed circuit cards and boards, a dielectric sheet material is employed as the substrate. A conductive circuit pattern is provided on one or both of the major surfaces of the substrate.

In order to plate on the substrate, it must be seeded or catalyzed prior to the deposition of metal thereon. Included among the various dielectric materials suggested for such purpose are various organic polymers including polyimides.

Among the more widely employed procedures for catalyzing a substrate is the use of a stannous chloride sensitizing solution and a palladium chloride activator to form a layer of metallic palladium particles thereon. For instance, one method of catalyzing a dielectric substrate is exemplified by U.S. Pat. No. 3,011,920 which includes sensitizing a substrate by first treating it with a solution of a colloidal metal, activating the treatment with a selective solvent to remove unreactive regions from the colloids on the sensitized dielectric substrate, and then electrolessly depositing a metal coating on the sensitized substrate, for example, with copper from a solution of a copper salt and a reducing agent.

Also, as suggested, for example, in U.S. Pat. No. 3,009,608, a dielectric substrate can be pretreated by depositing a thin film of a "conductivator" type of metal particle, such as palladium metal, from a semicolloidal solution onto the dielectric substrate to provide a conducting base which permits electroplating with conductive metal on the conductivated base.

In addition, there have been various suggestions of treating substrates with certain materials in order to enhance the attachment to the substrate of a non-noble metal catalyst. For instance, U.S. Pat. No. 4,301,190 suggests a pre-wet treatment of a substrate with an "absorption modifier" to enhance the attachment to the substrate of a non-noble metal catalyst. Certain surfactants, hydrous oxide sols and certain complexing agents are suggested as "absorption modifiers".

However, the methods of catalyzing, or seeding, various organic polymer substrates and particularly polyimide substrates, have not been entirely satisfactory and improvement in the degree of adhesion of the final metal layer to the substrate has been less than desired.

In the packaging of semiconductor chips, polyimide films are often coated onto substrates. For instance, in the formation of multilayer substrates for mounting chips, one configuration employs an insulating substrate of a ceramic material onto which is deposited a pattern of metallic conductors. Usually, the conductors are three layers of metal being a layer of chromium, followed by a layer of copper, followed by an overlying layer of chromium. On top of the metallized ceramic substrate is placed a layer or film of a polyimide, and on top of the polyimide a second layer of a pattern of conductors is provided.

The metal contacting the polyimide on the second or subsequent layers can be, for instance, copper as disclosed in U.S. Pat. No. 4,386,116 to Nair, et al. and assigned to International Business Machines Corporation, the assignee of the present application, disclosure of which is incorporated herein by reference.

However, the adhesion between the copper and polyimide is not entirely satisfactory and could stand a degree of improvement. In particular, problems have occurred at the copper-polyimide interface resulting in lifting up of the copper line from the underlying polyimide substrate rendering the carrier unsuitable for its intended purpose.

Accordingly, in order that the configurations which involve a copper-polyimide interface be competitive in a commercial environment, it is necessary to improve the adhesion at the copper-polyimide interface.

Another use would be as a dielectric and/or circuit carrier for flexible circuits. This could involve spray coating or roller coating polyamic acid onto a sheet of metal (such as stainless steel or aluminum). The film is then cured or imidized, resulting in a film which is fully or substantially fully cured. The metal which the polyimide is on can be imaged, removed, or maintained. On top of the polyimide, three layers of metal are deposited such as by either evaporation or sputtering. The conductors are chromium or nickel, followed by a layer of copper, followed by a layer of chromium or nickel. By means of photolithographic operations, this metal is imaged into circuits. Depending on the use of the circuit, the cured polyimide may or may not be imaged, either before or after the formation of the circuit.

Flexible circuits may also be fabricated using freestanding polyimide films onto which metal layers are vacuum deposited, laminated, or glued. The metal circuit pattern is defined by using a photoresist pattern to either act as a plating mask or act as a mask for subtractive etching of the metal layer. Through-holes in the polyimide film can be made by drilling, punching, or etching.

In addition, the selective etching of fully imidized polyimide films to provide openings or vias therein is important for various uses of polyimide. For instance, in the packaging of semiconductor chips, polyamic acid films are often coated onto substrates and then cured either chemically or thermally.

In a number of these situations, it is necessary to form vias in the polyimide layer to allow for electrical connections to be made between the different layers of metallurgy. In order that the interconnection be as accurate as possible, it is necessary that the polyimide films be fully cured to avoid distortion of the desired polyimide pattern and prevent attack from other wet processing chemicals.

For instance, in the formation of multi-layer substrates for mounting chips it is necessary to electrically contact some of the conductors in the upper or second layer of metallization to some of the conductors on the lower or first layer of metallization. In order to do so, the polyimide must be selectively etched to form the desired vias therein to allow for metal connection between the upper and lower levels of metallization and connection to a chip and/or board.

Wet etching fully of substantially fully cured polyimide may be accomplished using either hydrazine hydrate, ethylenediamine, or concentrated caustic solutions. These are dangerous chemicals and are avoided by industry wherever possible. Ethylenediamine is highly toxic and irritating and hydrazine hydrate causes blindness and is extremely explosive. Concentrated solutions of sodium or potassium hydroxide are highly corrosive and can cause severe burns. If used, all three methods would require tools which are extremely expensive because of safety concerns.

It would, therefore, be desirable to provide a process for etching of fully cured or substantially fully cured polyimide that is relatively fast without requiring dangerous or explosive chemicals.

SUMMARY OF INVENTION

The present invention provides a method for treating certain organic polymeric materials in order to provide a metallic layer deposited thereon from an electroless plating bath. Moreover, the present invention provides for enhanced adhesion of the metal to the polymeric material. A further aspect of the present invention is concerned with rendering these organic polymeric materials readily etchable in aprotic solvents to thereby provide etching processes that are relatively easy to control and do not require hazardous chemicals.

Another aspect of the present invention is concerned with rendering these organic polymeric materials capable of being bonded together without employing further adhesive materials.

In particular, according to one aspect of the present invention, a method for conditioning at least one surface of an organic polymeric material that is capable of transporting electrons and counter ions in a reversible manner is provided. The process comprises supplying electrons to redox sites (i.e., sites which can undergo reduction and oxidation) of the polymeric material with concurrent uptake of counter cations from the electrolyte. The reduced polymeric material is then placed into contact with a solution that contains cations of a metal which will diffuse into the organic polymeric material and contact the redox sites thereof.

Metal deposited in such a manner can mediate continued electron transfer from the polymer resulting in further metal deposition near the previously deposited metal. The redox sites thereby transfer electrons to the cation that is energetically disposed to receiving electrons from the redox sites to thereby reduce the cation to metal atoms in the zero oxidation state. Next, a second metal is deposited from an electroless plating bath onto the zero oxidation metal.

The electrons are supplied to the redox sites of the polymeric material by either means of a cathode in an electrochemical circuit, the potential applied to the cathode being equal to or negative of the reduction potential of the polymer or preferably by means of a reducing agent in solution, the oxidation potential of the reducing agent being negative with respect to the reduction potential of the polymer. Alternatively, the electrons can be supplied to the redox sites of the polymeric material by contacting the polymeric material with tetrakis(dimethylamino)ethylene. The reducing agent may be in a charged or neutral form.

The polymer must possess chemical functionality whose reduction potential is negative relative to the reduction potential of the metal ions.

A further aspect of the present invention is concerned with etching an organic material wherein the organic polymeric material is capable of transporting electrons in a reversible manner. The method comprises supplying electrons to the redox sites of the polymeric material and then dissolving the polymeric material in its reduced form into an aprotic organic solvent. The electrons are supplied to the redox sites of the polymeric material by means of a cathode in an electrochemical circuit, the potential applied to the cathode being equal to or negative of the reduction potential of the polymer or preferably by means of a reducing agent in solution, the oxidation of the reducing agent being negative with respect to the reduction potential of the polymer. The polymeric material is then dissolved in an aprotic organic solvent. Alternatively, the electrons can be supplied to the redox sites of the polymeric material by contacting the polymeric material with tetrakis(dimethylamino)ethylene.

A still further aspect of the present invention is concerned with bonding together two surfaces of organic polymeric material wherein the organic polymeric material is capable of transporting electrons in a reversible manner. The method comprises supplying electrons to redox sites of the polymeric material of the surfaces to be bonded to create reduced regions therein, bringing together the surfaces whereby the reduced regions interpenetrate and form an interphase. Next, the reduced interphase region is reoxidized to thereby bond the surfaces together.

The electrons are supplied to the redox sites of the polymeric material by means of a cathode in an electrochemical circuit, the potential applied to the cathode being equal to or negative of the reduction potential of the polymer or preferably by means of a reducing agent in solution, the oxidation of the reducing agent being negative with respect to the reduction potential of the polymer. Alternatively, the electrons can be supplied to the redox sites of the polymeric material by contacting the polymeric material with tetrakis(dimethylamino)ethylene.

BEST AND VARIOUS MODES FOR CARRYING OUT THE INVENTION

The organic polymeric materials treated pursuant to the present invention must be capable of transporting electrons in a reversible manner. In particular, such polymers include polyimides, polyviologens such as polyxylylviologen, polyphthalocyanine, vinypyridine-containing polymers, polyamides, polysulfones, certain polyquinolines described in PCT International Publication No. WO83/02368, polyacetylenes, polyesters, such as polyterephthalates, and preferably the polyimides. The polyimides are preferred in view of their continually expanding use in providing electronic devices and packaging and in view of their widespread availability. Discussion of various electrochemical properties concerning polyimides can be found in U.S. Pat. No. 4,512,855 to Mazur; Haushalter, et al., "Thin Solid Films", 102, 161 (1983); Mazur, et al., "Electrochemistry of Aromatic Polyimides", Journal Electrochemical Society, Electrochemical Science and Technology, pp. 346-353, February 1987; and Mazur, et al., "Electrochemical Growth of Metal Interlayers and Polyimide Film", Journal of Physical Chemistry, 1986, 90, pp. 1365–1372.

By "reversible" is meant the capacity of the polymer to accept and donate electrons to another material or chemical entity at a finite rate without itself undergoing a change which limits this capacity. The chemical entity may be molecular, ionic, atomic, or adjacent redox sites within or in contact with the polymer. The electrons are characterized by an electrochemical potential fixed by the redox potential of the polymer, which potential is, in turn, negative to the reduction potential of the metal ions to be subsequently deposited. Accordingly, the polymer must possess chemical functionality whose redox potential is negative relative to the reduction potential of the metal ion. Examples of such functional groups include benzoquinone groups, aromatic nitro groups, aromatic carbonyl groups, aromatic ester groups, sulfones, Ru (II) tris (2,2'-bipyridyl), N-alkylpyridinium, and other electroactive functionality. The groups, as discussed above, are compatible with metal ions whose reduction potentials are more positive than the oxidation potential of the reduced electroactive polymer.

In addition, the polymer functionality must be reversibly redox active, that is, capable of accepting and donating electrons rapidly and without competing, irreversible chemical changes. This reversibility may require such precautions as exclusion of oxygen or potential proton donors. The polymer must also be able to take up sufficient solvent by swelling or absorption to permit diffusion of electrolyte ions into the polymer.

Preferably, the polymer should have a molecular weight sufficient that films of the material will maintain mechanical integrity in an electrolyte solution. The molecular weight required depends on the structure of the polymer and solvent and should generally be greater than 5,000–10,000 daltons.

The polyimides that can be treated in accordance with the present invention include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Generally, the polyimides include the following recurring unit:

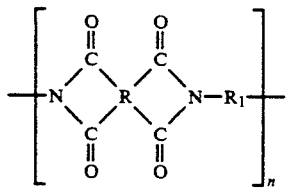

where n is an integer representing the number of repeating units to provide a molecular weight usually about 10,000 to about 100,000. R is at least one tetravalent organic radical selected from the group consisting of:

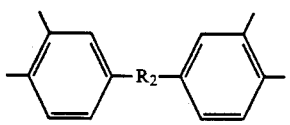

-continued

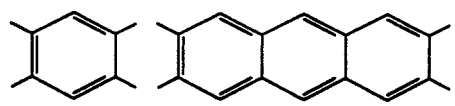

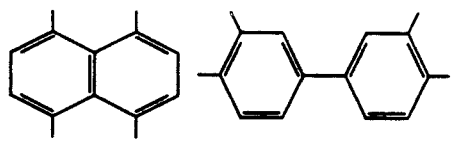

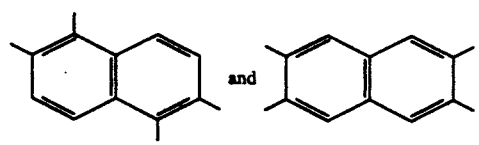

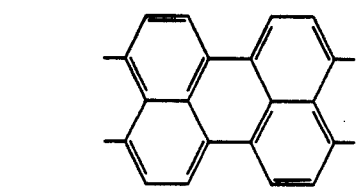

$R_2$ being selected from the group consisting of divalent aliphatic hydrocarbon radicals having from 1 to 4 carbon atoms and carbonyl, oxy, sulfo, sulfide, ether, siloxane, phosphine oxide, hexafluoroisopropylidene and sulfonyl radicals and in which $R_1$ is at least one divalent radical selected from the group consisting of an aliphatic organic radical or from the group shown:

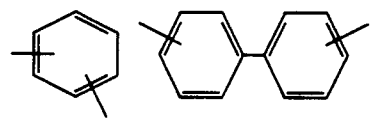

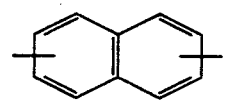

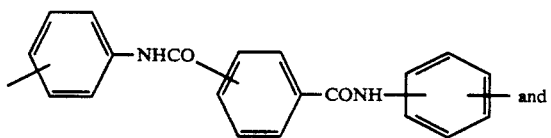

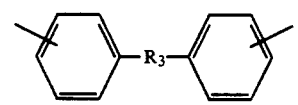

in which $R_3$ is a divalent organic radical selected from the group consisting of $R_2$, silico, and amino radicals. Polymers containing two or more of the R and/or $R_1$ radicals, especially multiple series of $R_1$ containing amido radicals, can be used.

Polyimides are available commercially from a variety of suppliers in one of three forms: a) as solutions of the polyamic acid precursors (e.g., DuPont Pyralin ®); b) as pre-imidized polyimide film (e.g., DuPont Kapton ® film); or c) as pre-imidized powders (e.g., Ciba-Geigy Matrimid 5218 ®) or solutions (e.g., Ciba-Geigy Probimide). The chemistry of commercial polyimides includes examples of many of the components listed above, but a preferred polymer for use pursuant to the present invention is based on the monomers pyromellitic dianhydride (PMDA) and oxydianiline (ODA, also named 4,4'-diaminodiphenyl ether). Other preferred polymers for use pursuant to the present invention are the polymers of benzophenonetetracarboxylic dianhydride (BTDA) and ODA and/or 1,3-phenylenediamine and the polymer of 3,3'-biphenylenetetracarboxylic acid (BPDA) and 1,4-phenylenediamine (PDA). Polyimide films based on PMDA-ODA are available from Allied Corporation under the tradename Apical ® and from Du Pont under the tradename Kapton ®. Films based on BPDA-PDA are available from Ube Corporation as Upilex ® and from Hitachi Chemical Company as PIQ-L100. Other tradename polyimides useful pursuant to the present invention include Durimid ® from Rogers Corporation and the Du Pont Pyralin ® series, including PI-2525 and PI-2566. The Upilex ® polyimides, although possessing higher thermal and dimensional stability than that of the Kapton ® polyimides, have not been widely used in integrated circuit packaging because of the absence of efficient wet etching processes for such polyimides.

Examples of suitable polyesters treated pursuant to the present invention are the polyethylene terephthalate polyesters such as Mylar ®. This material is widely used in electrophotography and packaging.

The present invention is capable of etching these polyimides as well as other difficult to etch, fully imidized polyimides.

The electrons can be provided by means of a cathode in an electrochemical circuit, the potential applied to the cathode being equal to or negative of the reduction potential of the polymer or preferably by means of a reducing agent in solution. The oxidation potential of the reducing agent must be negative with respect to the reduction potential of the polymer.

In order to facilitate understanding of the present invention, the details of the processes will be discussed with specific reference to polyimides. With respect to the polyimides, the bis-imide functional groups of the polymer can be reduced (by one electron) to the radical anion, or reduced (by two electrons) to the dianion or diradical dianion, or reduced (by three electrons) to the radical trianion as illustrated in the following reaction scheme for 3,3',4,4'-benzophenone tetracarboxylic diimide functional group where $e^-$ is an electron and $C^+$ is a counter cation.

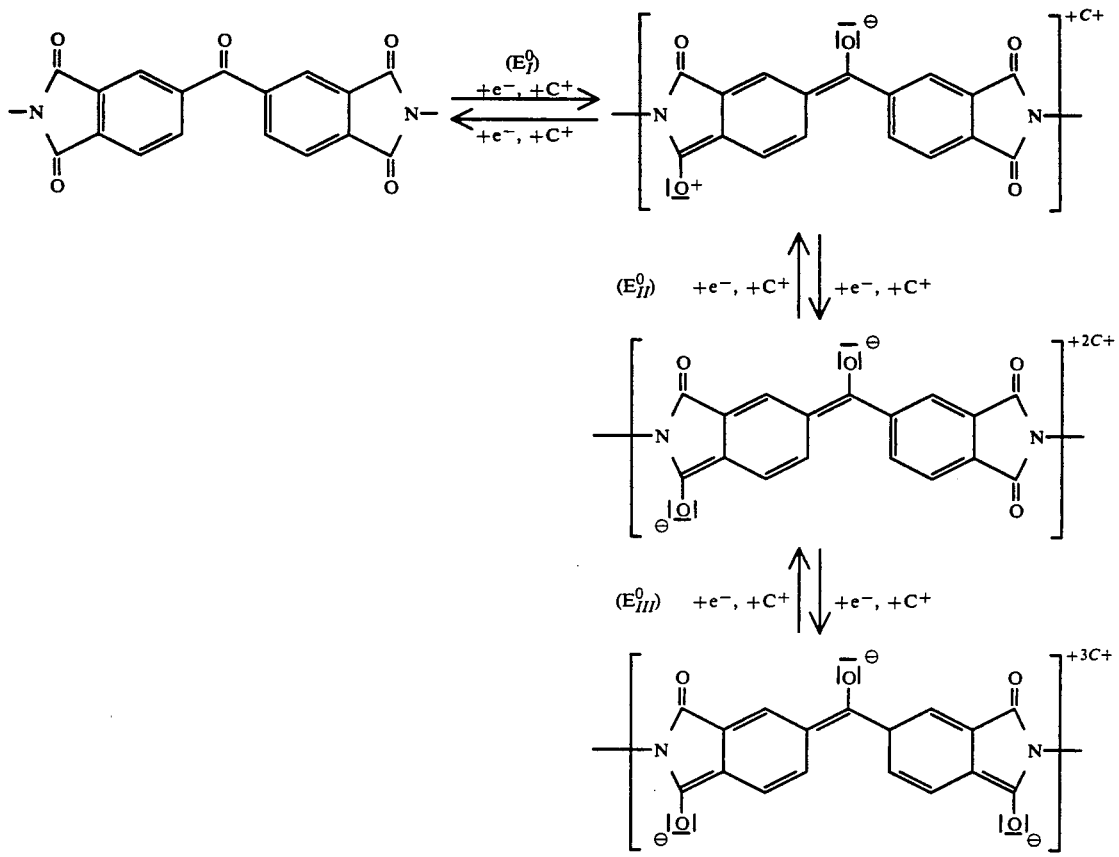

According to preferred aspects of the present invention, the reduction is achieved by means of a reducing agent that has an oxidation potential negative with respect to the reduction potential of the polymer. With respect to polyimides, compounds such as benzil anion, anthraquinone anion, benzophenone anion, benzoin dianion, sodium naphthalenide, anion of N,N'-di-n-butylpyromellitimide and even solvated electrons generated, for example, in liquid ammonia can be used as the reducing agent.

The reducing agents can be reducing agents, per se, or produced such as in situ by electrochemical means. The reducing agents can be generated by chemical reaction such as by reacting benzoin and potassium tert-butoxide or be a compound having a strong electron donating power such as tetrakis(dimethylamino)ethylene.

Examples of suitable organic compounds that can be electrochemically reduced to provide the chemical reducing agent include, but are not limited to, the following groups of compounds: unsaturated aromatic hydrocarbons (e.g., anthracene), aldehydes and ketones (e.g., benzaldehyde, dibenzoylmethane) imides (e.g., N-n-butylphthalimide, N,N'-di-n-butyl-3,3',4,4'-biphenyl tetracarboxylic diimide), carbodiimides (e.g., bis-(p-chlorophenyl carbodiimide), aromatic heterocyclic nitrogen compounds (e.g., 9,10-diazaphenanthrene), anhydrides (e.g., 1,8-naphthalic anhydride, 3,3',4,4'-benzophenone tetracarboxylic dianhydride), quinones (e.g., 9,10-anthraquinone), quaternary aromatic nitrogen compounds (e.g., 1-ethylpyridinium bromide), azomethines (e.g., N-p-biphenylbenzalimine), immonium salts (e.g., N-ethyl-N-methyl benzophenone immonium salt), azo compounds (e.g., 4,4'-azobiphenyl), amine oxides (e.g., acridine N-oxide), nitro and nitroso compounds (e.g., 2-t-butylnitrobenzene), and organometallic compounds (e.g., dibiphenylchromium (I) iodide).

Benzil, 9-fluorenone, benzophenone and anthracene are examples of specific compounds that can be reduced to provide the chemical reducing agents suitable for carrying out the present invention. The compounds can be reduced by applying such to an electrochemical cell containing an anode and a cathode and then applying a voltage.

The compounds can be reduced electrochemically or by bulk electrolysis. Typically, this is done using a two-compartment cell whereby the compartments are separated by a sintered glass disk or frit having a porosity of less than 8 μm. A salt bridge or semi-permeable membrane also could be used to separate the compartments. The working compartment is housed with a cathode electrode which is comprised of a metal such as platinum, mercury, or stainless steel. The anode electrode is comprised of a conductor such as platinum, carbon, or stainless steel. For potentiostatic operation, an appropriate reference electrode is positioned in the working compartment (e.g., Ag/0.1M Ag NO$_3$). The cell can be purged with an inert gas such as N$_2$ or argon using an inlet tube and one-way valve or operation can be done in a glove box under an inert atmosphere.

Electrochemical generation of the reducing agent is accomplished by either galvanostatic, potentiostatic, or voltage-controlled electrolysis. Typically, the current density range for galvanostatic reduction is 0.1 to 2 mA/cm$^2$. In potentiostatic mode, reduction is typically done by applying a potential to the cathode which is more negative (e.g. −50 mV or more) than the reduction potential for the organic compounds as measured against the same reference electrode.

Compounds such as potassium tert-butoxide can react with aromatic ketones and alcohols to form anionic species. For instance, potassium tert-butoxide reacts with benzoin to form the benzoin dianion.

In addition, the composition used to reduce the polymer will include in the solution a supporting electrolyte and preferably a supporting electrolyte salt that contains as cation a member from one of the following groups: tetraalkylammonium, tetraalkylphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl, propyl, isopropyl, pentyl, hexyl, or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following: tetrafluoroborate, hexafluorophosphate, aryl sulfonate, perchlorate, or halide such as bromide or iodide.

The electrolyte solution is preferably comprised of an aprotic solvent. The aprotic solvents suitable for use in this invention include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide, ester, cyclic ester, and ether compounds (e.g., propylene carbonate, ethylene carbonate, γ-butyrolactone, ethyl acetate, tetrahydrofuran, dimethylether), oxide and sulfo compounds (e.g., dimethylsulfoxide, acetone, liquid sulfur dioxide, sulfolane, dimethylsulfone).

The reducing agents generated electrochemically, according to the present invention, are typically neutral organic molecules which are electrochemically charged, thereby transferring electrons to the polymer, thereby reducing it. The electron transfer returns the reducing agent back to its neutral state. This is in sharp contrast to those reducing agents such as Zintl complexes that result in anions remaining with the polymer or are intercalated.

It has also been found, pursuant to the present invention, that the electrons can be supplied by contacting the polymeric material with tetrakis(dimethylamino)ethylene. Tetrakis(dimethylamino)ethylene (TKDE) is represented by the formula:

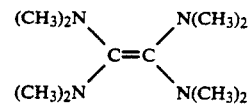

The TKDE can be used as such or employed in solution with an organic solvent including the aprotic solvents discussed above. Also, protic solvents such as water and alcohols including methanol, ethanol, and ethylene glycol can be used provided such are made alkaline (e.g.—adding a base). The TKDE reduces sites of the polymeric material to, for example, the radical anion-form while it is concurrently oxidized to a cation form. The TKDE cations function as counter-species to balance the charge imparted to the polymer in order to maintain electroneutrality throughout the polymer. The oxidized TKDE (cation) can subsequently be regenerated to neutral TKDE, for example, by reductive electrolysis. This material can function as the solvent and counter-ions in addition to its reducing agent function.

The polyimide, which, after being reduced by the reducing agent contains a region of reduced polyimide near the exposed surface, can then be exposed to a solution of the metal ion in order to provide the metallic sites or seeds for subsequent metallic plating.

In particular, the solution can contain a cation of the desired metal such as palladium, platinum, silver, gold, copper, cobalt, and nickel which will contact the redox sites of the polyimide. The redox sites, which are in the reduced state, will thereby transfer electrons to the cation to reduce it to metal atoms in the zero oxidation state.

The deposit of the metal can be continuous (i.e., electrically conductive), but is preferably a non-continuous deposit which is on the surface or preferably embedded within the surface of the polymer to a limited depth below the polymeric surface. It is important that the depth below the surface of the polymer at which the metallic deposit is present be limited so as to provide enhanced adhesion with the subsequent metallic coating on the polymer. Subsequent metallic plating within the polymer surface initiated at the embedded metallic sites or seeds introduces interpenetration of the metal deposit and polymer chains to enhance the adhesion through a mechanical interlocking or the formation of metallic "roots" to anchor the surface metallization to the polymer. In particular, the deposit should desirably be no greater than about 2,000 angstroms below the surface of the polymer, preferably no greater than about 800 angstroms and most preferably be no greater than about 200 angstroms. The minimum depth below the surface for enhanced adhesion is usually about 30 angstroms.

The degree of polymer reduction or density of reduced redox sites and the depth of penetration of the reduced polymer layer depends on the rate of solvent absorption by the polymer, temperature, the concentration and mobility of the counter ions through the polymer, the concentration and reducing potential of the reducing agent, the physical surface and cure conditions of the polymer, and time for exposing the polymer to the reducing solution.

The depth to which the metal cations will migrate into the polymer depends upon the concentration of the cation in the solution, the mobility and diffusion rate of the cation through the polymer, degree of polymer reduction and the depth to which polymer is reduced, the time for exposing the polymer to the solution and the rate of electron transfer between reduced redox site and cation. The rate of cation reduction mediated through previously reduced metal may be different than transfer between redox site and cation and, if faster, can catalyze reduction of metal at previously deposited metallic atoms or clusters. For example, Kapton ® films exposed to a solution of 0.05M benzil with 20% being in the reduced form (radical anion) for 4 minutes, 2 minutes, and 30 seconds, and then immersing in a solution of PdCl$_2$ in acetonitrile having a concentration of 0.005M for 4 minutes results in Pd metal deposit in a depth of 7,000 angstroms, 4,000 angstroms, and 700 angstroms, respectively. Also, it has been found that in order to ensure diffusion of the metal ions into the film for the reduction, that the top layer of the film can be oxidized such as contacting with oxygen or a solution containing an oxidizing agent such as tetrachloro-1,4-benzoquinone having a concentration less than 0.001M for less than 5 seconds prior to exposure to the metal cation solution.

The amount of metal deposited depends on the amount of excess charge on the reduced polymer surface. A surface which is lightly reduced (<5 minutes in reduction bath) will result in a diffuse (non-continuous) metal deposit, whereas a more heavily reduced surface (>5 minutes in reduction bath) can result in a continuous metal layer. The continuous metal layer can then be used to further deposit metal by electrolytic means without requiring an electroless plated strike layer.

The optimum process parameters can be readily determined by persons skilled in the art once aware of the present disclosure. The operations of this invention can be done at any temperature convenient for use with the solvent under an inert atmosphere, such as a blanket of nitrogen, argon, neon, helium, or hydrogen, the preferred being room temperature and nitrogen.

In addition, an alternative process can be used for depositing the seed metal. In this case, the polymer film is contacted with a solution of the metal cations in a solvent which will cause swelling of the polymer film and concurrent absorption of metal cations. Exposure of the swollen film to a solution of the reducing agent can then cause reduction of the seed metal cations to the metallic state. It is preferable to wash any salt from the surface of the polyimide film prior to contact with the solution of the reducing agent. The depth or positioning of the metal deposition will then depend on the relative rate of diffusion of the electrons from the reducing agent into the film versus that of the cations out of the film. These rates are controllable by adjusting the concentrations of the reactant and, therefore, the position of the metal ions beneath the surface for good adhesion can be readily controlled.

The electrons can be supplied to the redox sites of the polymeric material also by employing electrochemical means. In particular, the process involved requires providing the polymer onto a metal electrode which, when negatively biased, acts as a cathode in the circuit.

A typical arrangement to carry out this particular procedure pursuant to the present invention is illustrated in U.S. Pat. No. 4,512,855.

The combination of the electrode and polymeric film is then immersed into an electrolyte solution in an aprotic solvent.

In addition, the composition used to reduce the polymer will include in the solution a supporting electrolyte and preferably a supporting electrolyte salt that contains as cation a member from one of the following groups: tetraalkylammonium, tetraalkyphosphonium, alkali metal, aryl-alkylammonium, aryl-alkylphosphonium, or chelated metal. The preferred tetraalkylammonium group is tetrabutylammonium, but other tetraalkyls with alkyl group being methyl, ethyl propyl, isopropyl, pentyl, hexyl, or mixed alkyl thereof can be employed if desired. An example of a typical aryl group is phenyl and an aryl-alkylammonium is benzyltributylammonium. An example of a chelated metal cation is potassium 18-crown-6. The supporting electrolyte salt preferably contains as anion one of the following tetrafluoroborate, hexafluorophosphate, aryl sulfonate, perchlorate, or halide such as bromide or iodide.

The electrolyte solution is preferably an aprotic solvent. The aprotic solvents suitable for use in this invention include, but are not limited to, the following: nitrile and nitro compounds (e.g., acetonitrile, benzonitrile, nitromethane), amide and cyclic amide compounds (e.g., N,N-dimethylformamide, N-methylformamide, N,N-diethylformamide, N-ethylformamide, N,N-dimethylacetamide, N-methyl-2-pyrrolidone, hexamethylphosphoramide, ester, cyclic ester), and ether compounds (e.g., propylene carbonate, ethylene carbonate, $\gamma$-butyrolactone, ethyl acetate, tetrahydrofuran, dimethylether), oxide and sulfo compounds (e.g., dimethylsulfoxide, acetone, liquid sulfur dioxide, sulfolane, dimethylsulfone).

In the event that the electrons are supplied to the polymeric film by a cathode in an electrochemical circuit, the potential applied to the cathode must be equal to or negative of the reduction potential of the polymer for which typical values are given below.

The first electron reduction potential E° for various polyimides are given:

|  |  | $E°_1$ |
|---|---|---|
| PMDA-ODA | (Kapton ®) | −0.78 |
| BPDA-PDA | (Upilex ®) | −1.34 |
| BTDA-DAPI[1] | (XU-218 ®) | −1.04 |
| BTDA-APB[3] | (Thermid ®) | −0.96 |
| NTDA-ODA[2] |  | −0.64 |

The metal cations can be deposited both by being present in the solution of the electrolyte or introduced after the film has been reduced. The concentration of the supporting electrolyte in solution is usually about 1 to about 0.01M, preferably about 0.2 to about 0.05M. Also, the concentration of the metallic cations in order to control the depth of the diffusion to not more than 1,000 angstroms is usually less than about 0.010M and generally from about 0.005 to about 0.0001M.

Since metal will deposit only at the surface regions of reduced polymer, selective surface activation is readily obtainable by employing a resist mask or permanent resist on the polymeric film.

Materials which can be used as a mask include metals and photoresists such as Waycoat SC (J.P. Hunt) or KTFR (Kodak).

In fact, one use of the process of the present invention involves repairing pinhole defects in sputtered or evaporated metallic layers on an organic film. An example of such problem is that during production of certain polyimides in a roll format, slip agents (inorganic grains) are put onto the polyimide surface to make processing and handling of the material easier by reducing the amount of "sticking". These slip agents can be found up to 1 mil in diameter and can cause problems in the subsequent processing of the material, such as discontinuities in sputtered metal deposits. Other contaminants such as dust, lint, oils, and greases can introduce voids in the sputtered metal layer.

In order to obtain acceptable adhesion of copper circuitry to polyimide, expensive and complicated evaporation schemes are used. A layer of chromium metal is used as an adhesion layer, followed by evaporation of copper to provide a plating base layer for depositing thicker metal. The presence of this slip agent causes voids in the sputtered or evaporated metal layer and hence, a non-continuous plating base. Since the plating base also serves as a polyimide etch mask in certain applications, voids in the metal layer expose the polyimide in areas where etching is not wanted. A method is described by which voids in sputtered or evaporated metal layers can be metallized to form a continuous metal film.

By the present invention, the voids can be plated by exposing the polymer containing the metallic layer to the reducing agent or supplying electrons as discussed above so that only the exposed polymer is reduced. After this, the exposure of the reduced polymer to a composition of the material to provide seeding results in deposition of the seed on the polymer in the pinhole.

The seeded regions are then active towards electroless metal and can be contacted with an electroless metal plating composition such as a copper electroless bath to deposit metal in the pinhole areas to form a continuous metal layer with the already existing metal on the substrate.

The present invention can be used to treat the through-holes and blind-holes in a substrate, as well as the major surfaces of the substrate. In fact, the present invention can be employed to coat vias having diameters even less than 1 $\mu$m. Also, vias up to about 10 mil in diameter have been plated pursuant to the present invention.

Also, if desired, the vias or through-holes can be selectively metallized. For example, to selectively metallize only a via or through-hole, a dielectric substrate is coated with a material or resist which can not be activated by the process described above. Through-holes or vias can be made by patterning the resist and etching the structure or laser ablation through the resist material and dielectric. Hence, only the region in the through-hole is reduced, seeded, and plated in this process. Selective metallization of the via or through-hole wall is obtained by having an appropriate photoresist or other material on the polymer surface which does not seed or can be removed (liftoff) following the seeding process. Another approach involves coating a patterned resist with another resist which protects the under-resist from the seeding process.

Silicon nitride can be used as a mask for selective seeding. It has also been observed that when polyimide is exposed to reactive ion etching (RIE), it does not undergo effective seeding according to the present invention, probably due to oxidation of the polyimide surface. Furthermore, polyimide exposed to RIE can again be rendered susceptible to seeding according to the present invention by, for example, treatment in a gas environment of about 3–10% hydrogen in nitrogen for about 15–30 minutes. Therefore, the polyimide exposed to RIE can be used as a mask for selective seeding of such polyimide which has subsequently been treated in a gas environment described above, or by polyimide not previously exposed to RIE.

In addition, according to the present invention, when electrochemically generated reducing agents or chemical reducing agents, or tetrakis(dimethylamino)ethylene are used to reduce the polymer, it is not necessary to utilize a separate seed step prior to the metal deposition. The metal can be directly deposited from the electroless bath.

The reduced polymer sites act as the catalyst whereby the electroless metal plating is initiated by electron transfer from reduced polymer sites to metal cations in the electroless bath which deposits metal in situ and permits continued electroless plating due to the oxidation of the reducing agent provided in the electroless plating bath.

After the polymer is conditioned to render it susceptible for subsequent deposition of a metal from an electroless metal plating bath, the film is exposed to an electroless metal plating bath. Suitable metals include copper, nickel, gold, palladium, cobalt, silver, platinum, tin, or mixtures thereof. The preferred metals are copper, nickel, and palladium. Suitable copper electroless plating baths and their method of application are disclosed in U.S. Pat. Nos. 3,844,799 and 4,152,467, disclosures of which are incorporated herein by reference, except that it is preferred to use a low cyanide concentration or exclude the cyanide for purposes of this invention.

The copper electroless plating bath is generally an aqueous composition that includes a source of cupric ion, a reducing agent, a complexing agent for the cupric ion, and a pH adjuster. Such also usually include a cyanide ion source and a surface-active agent. Cyanide ions should be excluded or controlled to low levels (i.e.— 1-4 ppm) when using a surface seeded with Pd metal in accordance with the present invention since the cyanide can complex and dissolve the Pd.

The cupric ion source generally used is cupric sulfate or a cupric salt to the complexing agent to be employed.

When employing cupric sulfate, it is usually employed in amounts of about 3 to about 15 grams/liter and more usually from about 8 to about 12 grams/liter. The most common reducing agent is formaldehyde which is generally used in amounts from about 0.7 to about 7 grams/liter and more usually about 0.7 to about 2.2 grams/liter.

Examples of some suitable complexing agents include Rochelle salts, ethylenediaminetetraacetic acid, the sodium (mono-, di-, tri-, and tetra-sodium) salts of ethylenediaminetetraacetic acid, nitrilotetraacetic acid and its alkali salts, gluconic acid, gluconates, triethanolamine, glucono-(gamma)-lactone, and modified ethylenediamine acetates such as N-hydroxyethylethylenediaminetriacetate. In addition, a number of other suitable cupric complexing agents are suggested in U.S. Pat. Nos. 2,996,408; 3,075,856; 3,075,855; and 2,938,805. The amount of complexing agents dependent upon the amount of cupric ions present in solution is generally from about 20 to about 50 grams/liter or in a 3-4 fold molar excess.

The plating bath also usually contains a surfactant that assists in wetting the surface to be coated. A satisfactory surfactant is, for instance, an organic phosphate ester available under the trade designation GAFAC RE-610. Generally, the surfactant is present in amounts from about 0.02 to about 0.03 grams/liter. Also, the pH of the bath is generally controlled, for instance, by the addition of a basic compound such as sodium hydroxide or potassium hydroxide in the desired amount to achieve the desired pH. The pH is usually between about 11.6 and 11.8.

The plating baths generally have a specific gravity within the range of 1.060 to 1.080. The temperature of the bath is usually maintained between 70° C. and 80° C. and more usually between 70° C. and 75° C. The $O_2$ content of the bath is generally contained between about 2 ppm and about 4 ppm and more usually about 2.5 ppm to about 3.5 ppm by injecting oxygen and an inert gas into the bath. The overall flow rate into the bath is usually from about 1 to about 20 SCFM per thousand gallons of bath. In addition, the polymers in the reduced state obtained in the manner disclosed above and especially the polyimides can be readily and selectively etched by dissolving the reduced polymeric material in an aprotic organic solvent.

The dissolution or etching of partially to fully imidized or cured polyimides is based on reduction of the polyimide by either direct electrochemical reduction at an electrode surface or through chemical reduction using a reducing agent in an electrolyte solution in contact with the polyimide film. Also, the polymeric material can be treated by providing electrons by contacting the polymeric material with TKDE. Unlike the wet etching methods involving hydroxide or hydrazine, the present approach exploits the ability of polyimide to undergo reversible electron transfer.

Polyimide films which are cast, laminated, or deposited onto a conductive substrate would act as a polyimide modified electrode and could be electrochemically reduced in an electrolyte solution.

The preferred method for etching polyimide films (those free-standing or present on a substrate) is by chemical reduction. This process utilizes the reversible redox behavior of polyimides to generate the reduced bisimide forms as described for polyimide film reduction above. For chemical reduction there is no electrode or external circuit to "directly" supply the electrons. Instead, dissolved reducing species or agents in the electrolyte are the source of electrons. A fundamental requirement for the reductant is that it has a sufficiently negative reducing power or potential to allow electron transfer to thermodynamically take place. It is also important that the kinetics of the electron exchange are not inhibiting. The chemical etching method has the advantage over electrochemical etching because complete film electroactivity is not required since any bisimide groups coming in contact with the reducing solution will undergo electron transfer causing solubilization of the polymer.

The solubility of the polymer depends on the solvent, supporting electrolyte ions, temperature, degree of solution mass transfer, and reduced state of the polymer. In general, the more reduced forms of the polymer have greater solubility, for example, for Kapton ® films, the dianion (two-electron reduced) form is more soluble than the radical anion (one-electron reduced) form. The dissolution mechanism is primarily attributed to increased repulsion between polymer chains in the reduced state due to increased solvation and counterion uptake. The excess charge effect could lower the cohesive binding energy to allow the polymer to dissolve.

The polyimides dissolve into the solvent in the reduced form. UV-Vis analysis of the resulting solution show that the dissolved species are present in the reduced states. The most effective solvents for dissolving the reduced polyimides are aprotic polar solvents, including amides (N-methyl-2-pyrrolidone, N,N-dimethylformamide and dimethylacetamide), oxides (N,N-dimethylsulfoxide), cyclic esters (propylene carbonate, γ-butyrolactone), and nitriles (acetonitrile). The etch solution will also contain a supporting electrolyte salt of the type discussed above. Profiling or two-dimensional patterning of the polyimide can be accomplished by using a photoresist such as Waycoat SC or KTFR (or other ion barrier mask) pattern on the polyimide prior to polyimide reduction.

The etching process of the present invention is especially advantageous since it can be used to etch polyimides that are difficult to etch such as the fully cured or imidized polyimides, for example, the Upilex ® polyimides.

Patterned etching, according to the present invention, results in anisotropic etching with the sidewalls of the etched area being tapered inwardly as the etching proceeds through the depth of the material.

In addition, it has been found, according to the present invention, that the use of photoresists as the mask for selective etching results in some undercutting of the mask by the etchant. However, it has been found, according to certain preferred aspects of the present invention, that this undercutting can be at least significantly reduced, if not entirely eliminated, by employing a conductive metal as the etch mask. The use of a metal mask results in anisotropic etch with the sidewalls being tapered inwardly as the etching proceeds downward in the substrate.

In view of the anisotropic profile achieved by the selective etching according to the present invention, through-holes having a V-shaped configuration with the apex of the V being open. In fact, a sandwich of two or more substrates can be etched from both sides, resulting in a V-like profile from each surface converging towards each other with the apex of each V being open to some extent. The V-like tapered through-holes are desirable since such can lead to enhanced plating.

Moreover, with respect to etching, there is no swelling of the remaining polymer as experienced with other wet etching techniques.

A further aspect of the etching is that different polymers such as even different polyimides can have different reduction potentials. Because of this, reducing agents can be utilized with a reduction potential sufficiently negative to allow electron transfer to take place with one type of polymer, but not sufficiently negative to reduce another polymer. In fact, even the same polymer at different cure levels can have different dissolution rates. In other words, the same polymer at a different cure level can be used as the etch stop.

A further aspect of the present invention is bonding polymeric materials together. For instance, an important concern for many uses is adhesion between polyimide layers. This is an especially difficult problem since polyimide-to-polyimide adhesion is poor due to the chemical inertness and unreactivity of these materials. The interface must also be absent of voids since contaminants can be introduced along crevices which leads to premature device failure.

The present invention bonds two polymeric materials together without creating a distinct interface between the materials. In particular, the process comprises supplying electrons to redox sites of the polymeric material of both surfaces to create reduced regions therein. The organic polymeric materials being capable of transporting electrons in a reversible manner. As an example, adjacent polyimide surfaces are reduced to generate anionic forms of the polymer.

The anionic forms of polyimides are soluble and dissolve in the reduced state while remaining a polyimide. In the reduced form, two surfaces can dissolve into each other, allowing the polymeric chains to interpenetrate.

The treated surfaces are then brought together with the reduced regions of each adjacent to each other such as by laminating or pressing the surfaces containing the reduced regions together. The reduced regions are permitted to interpenetrate and form an interphase. It has been observed that the reduced polyimide dissolves or dissociates from the polymer matrix in the solvent present in the reducing step. In the case of a polyimide, following reduction, the polyimide is dissolved in the imidized form (i.e.—the polyimide is essentially intact and present as a polyimide and not a polyamic acid salt or ring opened structure). This condition allows the two reduced surfaces to interpenetrate. Once the polyimide surfaces have merged into an interphase region, oxidation of the reduced polymer renders the polyimide insoluble and fuses the polyimides together. The residual solvent can be evaporated at elevated temperature and reduced pressures. The entrapped counter-ions are inert and immobile in the polyimide matrix under humid environments which the structure is likely to encounter in service. The advantage of the disclosed approach over chemical conversion or reaction of the polyimide structure is that no polyimide chemistry is required following joining since direct electron transfer regenerates the original polyimide state.

The adhesion of polyimide-to-polyimide is especially significant in thin film structures fabricated by parallel process techniques. In the parallel process scheme, thin film structures comprised of circuitized polyimide layers are stacked (or interconnected) to provide a multilevel wiring structure. The multilevel structure results in a large area where polyimide of one level contacts polyimide of another. Therefore, it may be critical that the polyimide/polyimide interface be structurally sound.

Adhesion between polyimide layers can be accomplished through the use of adhesives such as epoxy or acrylic based glues. However, the use of an adhesive introduces an additional material and layer. Furthermore, most adhesive expel solvents and other materials during curing. An alternative approach is to modify the polyimide polymeric structure at the surface to provide highly reactive or energetic bonding sites. Chemical conversion of the polyimide, however, might result in changes in the physical/dielectric properties of the polyimide. This joining results in an interphase region of polyimide providing a continuous transition between the bulk of the two adjacent polyimide layers. This process does not introduce an interface, nor require an adhesive material, or alter the polyimide chemistry.

The following non-limiting examples are presented to further illustrate the present invention.

EXAMPLES 1-4

A solution of about 0.05M benzil and about 0.1M tetrabutylammonium tetrafluoroborate (TBAFB) in acetonitrile (ACN) is reduced at a constant current of about 15 mA at a platinum mesh electrode. The measured potential is $-1.46V$ vs $Ag/0.1M$ $AgNO_3$ reference electrode. Benzil reduction is halted after about 14% is converted to the benzil radical anion form. The characteristic blue color of the radical anion of benzil is observed during reduction.

5 mil thick Kapton (PMDA-ODA) polyimide films measuring 2 inches×4 inches are exposed to the benzil reducing agent solution for 15 seconds, 30 seconds, 2 minutes, and 4 minutes to reduce the Kapton ® surface to the radical anion form. The films are rinsed with acetonitrile to remove any residual material from the surface of the substrate. Next, the films are immersed in a N,N'-dimethylformamide (DMF) solution containing about 0.05M $PdCl_2$ for 1 minute, resulting in Pd metal deposition and oxidation of the reduced polyimide surface to the neutral form. The surface is not electrically conductive after Pd deposition.

An electroless copper plating solution is made using 15 g/L $CuSO_4 \cdot 5H_2O$; 62 g/L $KNaC_4H_4O_6 \cdot 4H_2O$; 22 g/L NaOH, 20 ppm Gafac; and 7.5 ml/L 37% HCHO in water. The Pd seeded Kapton ® samples are immersed for 3 minutes in the electroless copper solution at room temperature. Highly reflective, uniform copper films are formed on the Kapton ® surface which are electrically conductive. Rutherford backscattering analysis of the plated surfaces shows that Pd is present at a depth of about 7,000 angstroms for the 4 minute reduced film, about 4,000 angstroms for the 2 minute reduced film, about 1,200 angstroms for the 30 second reduced film, and about 700 angstroms for the 15 second reduced film.

EXAMPLE 5

A solution containing 0.05M benzil and 0.1M tetraethylammonium tetrafluoroborate (TEAFB) in acetonitrile is reduced at a constant current of 37.5 mA. Reduction is discontinued after about 20% of the benzil is converted to the radical anion form.

2 mil thick Kapton ® films are immersed in the benzil reducing agent solution for 5 and 15 seconds, then rinsed in acetonitrile and immersed in an acetonitrile solution containing about 0.002M $PdCl_2$ for 30 seconds. These Pd seeded samples are held in an electroless copper solution of the type disclosed in Example 1 for 2.5 minutes. Highly reflective copper films are deposited onto the Kapton ® surface by this treatment.

These copper coated Kapton ® films are then heated at 90° C. under vacuum for 1 hour. Laminar UF (Dynachem) dry film photoresist (1.5 mil thick) is laminated to both sides. A line peel pattern is exposed through a mask and the photoresist developed in a sodium bicarbonate solution. The photoresist patterned substrates are electrolytically copper plated using a solution composed of 60 gm/L $CuSO_4 \cdot 5H_2O$ and 30 ml/L concentrated $H_2SO_4$ in water at a rate of 15 mA/cm$^2$ to increase the copper thickness to about 17 μm. The photoresist is stripped using 8% KOH in water solution and the electroless copper strike layer between the peel lines removed using dilute $FeCl_3$ in $H_2O$ solution. Peel tests (90°) using 30 mil wide copper lines show that the adhesion between the copper and the Kapton ® substrate is about 37 to 52 g/mm, the average being 42 g/mm with cohesive failure occurring within the polyimide.

Rutherford backscattering analysis shows that the Pd metal seed is present as a diffuse deposit to a depth of 800 angstroms into the Kapton ® film; for the 5 second reduced film, the Pd metal density in the diffuse region is $3.7 \times 10^{20}$ atoms/cm$^3$ and for the 15 second reduced film is $12.1 \times 10^{20}$ atoms/cm$^3$.

EXAMPLE 6

Polyimide (PMDA-ODA) films are prepared by spin coating polyamic acid, 10.7% in N,N-dimethylacetamide solution at 1,200 and 2,000 rpm onto stainless steel and silicon substrates. The films are then heated to 85° C. for 10 minutes.

The polyimide is thermally cured by heating at 150° C., 250° C., and 400° C. maintained for 60 minutes at each temperature to yield fully imidized films and which are 8.1 μm (2,000 rpm) and 12.9 μm (1,200 rpm) thick.

A solution containing 0.04M benzophenone and 0.1M TBAFB in DMF is reduced at a constant current of 70 mA until about 28% of the benzophenone is converted to the benzophenone radical anion. PMDA-ODA thermally imidized samples are exposed to the benzophenone reducing bath for 30 seconds, 60 seconds, 2 minutes, and 5 minutes, then rinsed with DMF and immersed in a 0.05M $PdCl_2$/DMF solution for 2 minutes. All samples seeded with Pd as described and exposed to an electroless copper plating solution of the type described in Example 1 show that highly reflective copper deposits are obtained.

EXAMPLE 7

Thermid 630 ® polyimide films derived from 3,3',4,4'-benzophenonetetracarboxylic dianhydride, available from National Starch and Chemical Company, are prepared by spin coating a 5% solution in N,N-dimethylacetamide onto silicon substrates. The films are cured by heating at 200° C. for 1 hour which give a final thickness of 3.9 μm.

Thermid ® polyimide films are exposed to a benzil reducing solution as in Example 1 for 60 seconds and then rinsed with acetonitrile. Next, they are immersed in a solution containing 0.001M $PdCl_2$ in ACN for 60 seconds. Exposing the Pd seeded films to an electroless copper plating solution as described in Example 1 for 2 minutes yields shiny copper deposits on the Thermid ® polyimide surface.

EXAMPLE 8

A solution composed of 0.05M anthracene and 0.1M TBAFB in DMF is reduced at a rate of 50 mA under galvanostatic conditions until about 10% of the anthracene is reduced. 2 mil thick Upilex ® polyimide films measuring 3 inches × 4 inches are immersed in the anthracene reducing solution for 2 minutes which caused the films to become dark blue-green due to surface reduction. The reduced films are rinsed using ACN and then exposed to a solution containing 0.002M $PdCl_2$ in acetonitrile for 60 seconds. The Pd seeded films were rinsed with acetonitrile, dried, and then held for 80 seconds in an electroless copper plating solution of the type disclosed in Example 1. This treatment results in a uniform, highly reflective copper deposit on the surfaces.

EXAMPLE 9

A solution containing 0.05M benzil and 0.1M tetraethyl ammonium bromide in propylene carbonate is reduced at 40 mA until 12% of the benzil was reduced.

Kapton ® polyimide (2 mil) immersed for 30 seconds in the solution prepared above, then rinsed with acetonitrile is exposed to a 0.001M $PdCl_2$/ACN solution. The Pd seeded Kapton ® is active towards electroless copper plating from a bath disclosed in Example 1.

EXAMPLE 10

A solution containing 0.05M benzil and 0.1M TBAFB in N-methyl-2-pyrrolidone (NMP) is reduced at a constant current of 40 mA until about 12% of the benzil is reduced.

Kapton ® polyimide (2 mil) immersed for 30 seconds in the solution prepared above, then rinsed with acetonitrile is exposed to a 0.001M $PdCl_2$/ACN solution. The Pd seeded Kapton ® is active towards electroless Cu plating from a bath of the type described in Example 1.

EXAMPLE 11

Palladium seeded polyimide films as prepared in Examples 1, 2, 6, and 7 using Kapton ®, Example 3 using thermally imidized PMDA-ODA, Example 4 using Thermid 630 ®, and Example 5 using Upilex ®.

An electroless nickel plating solution is made using 30 g/L $NiCl_2 \cdot 6H_2O$; 22 g/L Na citrate, 50 g/L $NH_4Cl$; 10 g/L Na hypophosphite and adjusted to pH 8.5 using concentrated $NH_4OH$ and held at 85° C. The Pd catalyzed polyimide films as described above are exposed to the electroless Ni plating solution for 2 minutes which results in highly reflective, electrically conductive nickel deposits.

EXAMPLE 12

Waycoat SC liquid photoresist is spun onto 2 mil Kapton ® film. The resist-coated Kapton ® is exposed through a mask having a VLSI packaging pattern. The resist is developed leaving behind a resist pattern having 2 mil lines on 4 mil centers. The substrate is treated as in Example 2 in order to deposit Pd seed metal on the Kapton ® regions not covered with resist. Exposing the Pd seeded substrate to an electroless copper plating solution as in Example 1 or an electroless Ni plating solution as in Example 8 gives a uniform, electrically conductive metal deposit on the Kapton ® surface not covered with resist. No electroless deposition occurred on the resist.

EXAMPLE 13

A solution containing 0.05M PdCl$_2$ and 0.1M TBAFB in DMF is prepared. A 2 mil Kapton ® film is immersed in the solution above for 3 minutes. Then the film is rinsed with acetonitrile. Next, the film is immersed in a benzil reducing bath as described in Example 2 for 15 seconds. The film is rinsed with ACN and then exposed to an electroless Cu plating solution of the type described in Example 1 for 2 minutes which gives a shiny copper deposit on the Kapton ®.

EXAMPLE 14

PMDA-ODA polyimide films are prepared by spin coating polyamic acid, 10.7% in N,N-dimethylacetamide at 1,200 rpm and 2,000 rpm onto stainless steel and conductive SnO$_2$ glass.

The polyimide is imidized by exposing the coated substrate to an atmosphere saturated with NMP at about 51° C. for 1.5 hours, followed by immersion in an equal volume mixture of anhydrous pyridine and acetic anhydride at 25° C. for 2 hours. The films are then rinsed with methanol and dried at 90° C. under vacuum for 1 hour. The final thickness of the polyimide films are 8.6 μm (2,000 rpm) and 13.5 μm (1,200 rpm). These coated structures are made into polyimide-modified electrodes by making electrical contact to the conductive layer on which the polyimide is deposited. Epoxy is used to cover this structure leaving only a region of the polyimide surface exposed.

A PMDA-ODA modified (working) electrode is immersed in a solution composed of 0.1M TBAFB in DMF and held at open circuit for 15 minutes. Next, a potential of −1.0V vs saturated calomel electrode (SCE) is applied to the working electrode for 10 minutes and then PdCl$_2$ in TBAFB DMF is added to yield a 0.8 mM PdCl$_2$ working solution and the electrode potential maintained at −1.0V for 20 minutes. The electrode is then removed from the cell and oxidized in air. After immersing the sample in an electroless copper plating solution as described in Example 1 for 2 minutes, a bright copper deposit is generated on the polyimide surface.

EXAMPLE 15

A solution comprised of 0.05M anthracene and 0.1M TBAFB in DMF is reduced at a constant current of 20 mA using a Pt mesh electrode (90 cm$^2$). The electrolysis is stopped after 25% of the anthracene is converted to the radical anion form. Kapton immersed in this solution etched at a rate of about 1 μm/min.

EXAMPLE 16

A solution of 0.05M benzophenone and 0.1M TBAFB in DMF was reduced at a constant current of 20 mA using a Pt mesh electrode in an electrochemical cell. When the amount of benzophenone converted to the radical anion form is 5%, 10%, 20%, and 40%, the electrolysis is halted and a Kapton ® film (5 mil thick) is immersed in the solution for 15 minutes. Then the film is removed, rinsed with DMF, then dried, and finally, the thickness measured. The etch rate for the Kapton ® is 0.66, 0.91, 1.0, and 1.5 μm/min for the 5%, 10%, 20%, and 40% reduced benzophenone solution, respectively.

EXAMPLE 17

A solution comprised of 0.0125M benzophenone and 0.1M TBAFB in DMF is reduced until about 10% of the benzophenone is converted to the anion form in a manner similar to that described in Example 16. Kapton ® polyimide etches at a rate of 0.2 μm/min when exposed to this solution.

EXAMPLE 18

A solution comprised of 0.05M benzil and 0.1M TBAFB in ACN is reduced at a constant current of 50 mA using a Pt mesh electrode in an electrochemical cell until about 10% of the benzil was converted to the radical anion form. A 2 mil thick Kapton ® film is immersed in the reducing bath for 15 minutes to reduce the polyimide to the radical anion form. The reduced film is then immersed in solution comprised of 0.1M TBAFB in DMF, thus causing dissolution of green colored radical anion form of the polyimide. UV-Vis analysis confirms that the polyimide dissolves in the DMF solution.

EXAMPLE 19

The experiment described in Example 18 is repeated, except that NMP is used instead of DMF. A similar dissolution of the reduced Kapton ® film into the NMP solution as in Example 18 occurs.

EXAMPLE 20

A PMDA-ODA polyimide film is prepared on a stainless steel electrode as in Example 14. The polyimide modified electrode is used as the cathode in an electrochemical cell containing 0.1M TBAFB in DMF solution. The cathode is held at a constant potential of −1.8V vs SCE. The polyimide film initially turns green and then becomes deep purple in color. After 10 minutes in this potentiostatic mode, a soluble purple colored product streams from the electrode surface and after 30 minutes, the film is entirely dissolved. Cyclic voltammetry of the dissolved polyimide solution using a Pt working electrode shows two reversible redox reactions corresponding to reduction of the pyromellitic dianhydride (PMDA) moiety to the radical anion and dianion states.

EXAMPLE 21

Example 20 is repeated using acetonitrile instead of DMF as the solvent.

Having thus described our invention, what we claim as new and desire to secure by Letters Patent is:

1. A method for conditioning at least one surface of an organic polymeric material that is capable of transporting electrons in a reversible manner which comprises supplying electrons to redox sites of said polymeric material by contacting said at least one surface of said organic material with an organic chemical reducing agent whereby the organic anion thereof is energetically disposed to transferring electron(s) to said redox sites in said organic polymeric material; then contacting said organic polymeric material with a solution that contains cations of a metal which will penetrate the said organic polymeric material and contact the redox sites, thereby transferring electrons to the cation that is energetically disposed to receiving electrons from said redox sites to thereby reduce the cation to metal atoms in the zero oxidation state; and then depositing a metal from an electroless bath onto the zero oxidation metal.

2. The method of claim 1 wherein said polymeric material is a polyimide wherein said polyimide is cured by any method by which imide ring cyclization can be obtained.

3. The method of claim 2 wherein said polyimide material is a free-standing or supported film derived from a dianhydride selected from the group of pyromellitic dianhydride, 3,3',4,4'-benzophenonetetracarboxylic dianhydride, 3,3',4,4'-biphenyltetracarboxylic dianhydride, naphthalenetetracarboxylic dianhydride, perylenetetracarboxylic dianhydride, 4,4'-(hexafluoroisopropylidene)bis-phthalic anhydride, and bis(3,4-dicarboxyphenyl)sulfide dianhydride.

4. The method of claim 2 wherein the thickness of said polyimide material is about 100 angstroms to 5 mil.

5. The method of claim 1 wherein said chemical reducing agent is a neutral organic compound whereby all or a portion of the said neutral organic compound has been electrochemically reduced in an aprotic solvent containing a supporting electrolyte salt.

6. The method of claim 5 wherein said neutral organic compound is at least one specie selected from the group of unsaturated aromatic hydrocarbons, aromatic carbonyl compounds, imides, diimides, carbodiimides, anhydrides, quinones, quaternary aromatic nitrogen compounds, aromatic heterocyclic nitrogen compounds, azomethines, immonium salts, azo compounds, amine oxides, nitro and nitroso compounds and organometallic compounds.

7. The method of claim 1 wherein said reducing agent is selected from the group of benzoin dianion, benzil anion, anthracene anion, dibenzoylmethane radical anion, benzdphenone anion, anthraquinone anion, 9-fluorenone, N-n-butylphthalimide anion, N,N'-di-n-butyl-3,3',4,4'-biphenyltetracarboxylic diimide anion, N,N'-di-n-butylpyromellitic diimide anion, acridine anion, and 1-azafluoranthene anion.

8. The method of claim 5 wherein said supporting electrolyte salt contains a cation which is at least one member of the group of tetraalkylammonium, tetraalkylphosphonium, alkali metal, mixed alkyl-aryl ammonium, mixed alkyl-aryl phosphonium, or chelated metal and said supporting electrolyte salt anion is at least one member selected from the group of tetrafluoroborate, hexafluorophosphate, perchlorate, halide, aryl sulfonate, and aromatic organic compounds.

9. The method of claim 5 wherein said supporting electrolyte salt contains at least one member selected from the group of tetrabutylammonium tetrafluoroborate, tetraethylammonium tetrafluoroborate, tetrabutylammonium hexafluorophosphate, tetraethylammonium bromide, lithium tetrafluoroborate, lithium perchlorate, benzyltributylammonium tetrafluoroborate, and sodium naphthalenide.

10. The method of claim 5 wherein said aprotic solvent is at least one member selected from the group of nitriles, nitro compounds, amides, cyclic amides, amines, esters, cyclic esters, ethers, carbonates, oxides, and sulfo compounds.

11. The method of claim 1 wherein said cation of said metal is selected from the group of palladium, platinum, ruthenium, silver, gold, copper, nickel, cobalt, and tin.

12. The method of claim 1 wherein said metals are at a depth no greater than 2,000 angstroms below the surface of said polymeric material.

13. The method of claim 1 wherein said metals are at a depth no greater than 800 angstroms below the surface of said polymeric material.

14. The method of claim 1 wherein said metals are at a depth no greater than 200 angstroms below the surface of said polymeric material.

15. The method of claim 1 wherein the said organic polymeric material surface is patterned with a photoresist, metal, or non-electroactive coating to act as a mask and thereby expose specific areas of the organic polymer surface to the said reducing agent and thereby depositing zero valent metal only in the exposed areas.

16. The method of claim 15 wherein the said photoresist or said metal mask is removed by dissolution, leaving a two-dimensional metal pattern remaining on the polymeric surface.

17. The method of claim 1 wherein said organic polymeric material is a polyester.

18. The method of claim 17 wherein said polyester is polyethylene terephthalate.

19. The method of claim 1 which further comprises, prior to said supplying electrons in a reversible manner, coating metal onto said organic polymeric material, resulting in pinholes and exposed organic polymeric material.

20. The method of claim 1 wherein said organic polymeric material includes a through-hole and/or blind via structure.

21. The method of claim 20 wherein only the polymeric material at the sidewalls of said through-holes have electrons supplied to redox sites thereof.

22. The method of claim 1 wherein said cations are supplied by an electroless plating bath for deposition of a zero oxidation metal and for further deposition of metal onto zero oxidation metal from said electroless plating bath.

23. The method of claim 1 wherein said metal cations are introduced after reduction of organic polymer.

24. The method of claim 23 wherein said at least one surface is contacted with a solution containing a chemical reducing agent; then said at least one surface is removed from said solution and thereafter contacted with said solution that contains cations of a metal.

25. The method of claim 1 wherein the at least one surface to which electrons are supplied is also the at least one surface that is contacted with said solution that contains cations of said metal.

26. A method for supplying electrons to at least one surface of an organic polymer that is capable of transporting electrons in a reversible manner which comprises supplying electrons to redox sites of said at least one surface by contacting said at least one surface with an organic chemical reducing agent whereby the organic anion thereof is energetically disposed to transfer electrons to said redox sites and thereby creating a region of reduced organic polymer in the vicinity of the said at least one surface contacted with said reducing agent and wherein said reducing agent has an oxidation potential more negative than the reduction potential of said polymer.

27. The method of claim 26 wherein said reducing agent is selected from the group of benzoin dianion, benzil anion, anthracene anion, dibenzoylmethane radical anion, benzophenone anion, anthraquinone anion, 9-fluorenone, N-n-butylphthalimide anion, N,N'-di-n- butyl-3,3',4,4'-biphenyltetracarboxylic diimide anion, N,N'-di-n-butylpyromellitic diimide anion, acridine anion, and 1-azafluoranthene anion.

28. The method of claim 26 wherein the said at least one surface contacted with said reducing agent is thereafter contacted with a solution that contains cations of a metal which will contact the said redox sites.

29. The method of claim 28 wherein said metal cations are introduced after reduction of organic polymer.

30. The method of claim 29 wherein said at least one surface is contacted with a solution containing a chemical reducing agent; then said at least one surface is removed from said solution and thereafter contacted with said solution that contains cations of a metal.

31. A method for conditioning at least one surface of an organic polymeric material that is capable of transporting electrons in a reversible manner which comprises supplying electrons to redox sites of said at least one surface of said polymeric material by contacting said at least one surface with an organic chemical reducing agent whereby the organic anion thereof is energetically disposed to transferring electrons to said redox sites of said at least one surface and thereby creating a region of reduced organic polymer in the vicinity of the said at least one surface contacted with said reducing agent.

32. The method of claim 31 wherein said reducing agent is selected from the group of benzoin dianion, benzil anion, anthracene anion, dibenzoylmethane radical anion, benzophenone anion, anthraquinone anion, 9-fluorenone, N-n-butylphthalimide anion, N,N'-di-n-butyl-3,3',4,4'-biphenyltetracarboxylic diimide anion, N,N'-di-n-butylpyromellitic diimide anion, acridine anion, and 1-azafluoranthene anion.

33. The method of claim 31 wherein the said at least one surface contacted with said reducing agent is thereafter contacted with a solution that contains cations of a metal which will contact the said redox sites.

34. The method of claim 33 wherein said metal cations are introduced after reduction of organic polymer.

35. The method of claim 34 wherein said at least one surface is contacted with a solution containing a chemical reducing agent; then said at least one surface is removed from said solution and thereafter contacted with said solution that contains cations of a metal.

* * * * *